United States Patent
Tseng et al.

(10) Patent No.: US 10,588,184 B2
(45) Date of Patent: Mar. 10, 2020

(54) LIGHT EMITTING DEVICE AND LED PACKAGE STRUCTURE

(71) Applicant: EVERLIGHT ELECTRONICS CO., LTD., New Taipei (TW)

(72) Inventors: Te-Wei Tseng, New Taipei (TW); Pyng Yu, New Taipei (TW)

(73) Assignee: EVERLIGHT ELECTRONICS CO., LTD., New Taipei (TW)

( * ) Notice: Subject to any disclaimer, the term of this patent is extended or adjusted under 35 U.S.C. 154(b) by 0 days.

(21) Appl. No.: 15/730,392

(22) Filed: Oct. 11, 2017

(65) Prior Publication Data
US 2018/0103513 A1    Apr. 12, 2018

Related U.S. Application Data

(60) Provisional application No. 62/462,926, filed on Feb. 24, 2017, provisional application No. 62/407,484, filed on Oct. 12, 2016.

(51) Int. Cl.
*H05B 33/08* (2006.01)
*H01L 25/075* (2006.01)
(Continued)

(52) U.S. Cl.
CPC ..... *H05B 33/0803* (2013.01); *H01L 25/0753* (2013.01); *H01L 33/36* (2013.01);
(Continued)

(58) Field of Classification Search
CPC ...... H05B 33/0803; H01L 2924/00014; H01L 2924/181; H01L 25/0753; H01L 33/60;
(Continued)

(56) References Cited

U.S. PATENT DOCUMENTS 7,206,507 B2    4/2007    Lee et al.
7,847,303 B2    12/2010   Jung et al.
(Continued)

FOREIGN PATENT DOCUMENTS

EP    2 216 834 A1    8/2010
EP    2 618 391 A2    7/2013
(Continued)

OTHER PUBLICATIONS

Communication dated Apr. 25, 2018, from the Intellectual Property Office of Taiwan in counterpart application No. 106134921.
(Continued)

*Primary Examiner* — Christopher Stanford
(74) *Attorney, Agent, or Firm* — Sughrue Mion, PLLC

(57) ABSTRACT

A light-emitting device including a substrate, plural light-emitting units, and a sealing member is disclosed. The substrate includes plural electrode pads. The light-emitting units are disposed on the substrate and each include an LED chip. The LED chips are electrically connected with the electrode pads. The sealing member is disposed on the substrate, covers a side surface of each of the light-emitting units, and includes a surrounding portion surrounding the light-emitting units and a separating portion disposed between the light-emitting units. An LED package structure including the aforementioned substrate, light-emitting units, and sealing member is also disclosed. The light-emitting units can generate light of different colors or color temperatures and allow adjustment of the colors or color temperatures.

18 Claims, 5 Drawing Sheets

(51) Int. Cl.
  *H01L 33/54* (2010.01)
  *H01L 33/36* (2010.01)
  *H01L 33/60* (2010.01)
  *H01L 33/56* (2010.01)
  *H01L 33/50* (2010.01)
  *F21Y 115/10* (2016.01)

(52) U.S. Cl.
  CPC .............. *H01L 33/54* (2013.01); *H01L 33/60* (2013.01); *F21Y 2115/10* (2016.08); *H01L 33/504* (2013.01); *H01L 33/56* (2013.01)

(58) Field of Classification Search
  CPC ... H01L 33/54; H01L 33/56; H01L 2933/005; F21Y 2115/10; F21Y 2105/10
  See application file for complete search history.

(56) References Cited

U.S. PATENT DOCUMENTS

| | | |
|---|---|---|
| 8,330,182 B2 | 12/2012 | Suenaga |
| 2007/0246729 A1 | 10/2007 | Park |
| 2009/0215210 A1 | 8/2009 | Fan et al. |
| 2012/0261681 A1 | 10/2012 | Ooyabu et al. |
| 2015/0108508 A1* | 4/2015 | Wu .................. G02F 1/157 257/84 |
| 2015/0262987 A1* | 9/2015 | Wada .................. H01L 33/46 257/98 |
| 2015/0263247 A1 | 9/2015 | Wada et al. |
| 2016/0087168 A1 | 3/2016 | Huang et al. |

FOREIGN PATENT DOCUMENTS

| | | |
|---|---|---|
| EP | 2 760 046 A2 | 7/2014 |
| JP | 2008085026 A | 4/2008 |
| JP | 4222192 B2 | 2/2009 |
| WO | 2010/035206 A1 | 4/2010 |
| WO | 2016/080769 A1 | 5/2016 |

OTHER PUBLICATIONS

Communication dated Jan. 9, 2018 from the European Patent Office in counterpart application No. 17195914.1.

* cited by examiner

LIGHT EMITTING DEVICE AND LED PACKAGE STRUCTURE

CROSS-REFERENCE TO RELATED APPLICATIONS

This patent application claims the benefit of U.S. Provisional Patent Application No. 62/407,484, filed on Oct. 12, 2016, and U.S. Provisional Patent Application No. 62/462,926, filed on Feb. 24, 2017.

TECHNICAL FIELD

The present invention relates to a light-emitting device and a light-emitting diode (LED) package structure. More particularly, the invention relates to a light-emitting device with a plurality of light-emitting units and to an LED package structure also with a plurality of light-emitting units.

BACKGROUND

In order for a light-emitting device to generate light of multiple colors or color temperatures and thereby provide rich or diverse lighting effects, one conventional approach is to dispose at least two LED chips on a substrate and cover the LED chips and the substrate with an encapsulant, wherein the LED chips themselves can emit light of different colors respectively or can work in conjunction with phosphor powder to generate light of different colors. If, however, the LED chips are not properly arranged on the substrate, the light emitted by one of the LED chips may fall on the other LED chip or the neighboring phosphor powder, producing unexpected light that compromises the colors or color temperatures of the light of the light-emitting device.

Moreover, a conventional light-emitting device with multiple LED chips generally includes an epoxy molding compound (EMC) lead frame, to which the LED chips are directly bonded. More specifically, all the LED chips are bonded to a recessed area of the lead frame, with bonding wires of the LED chips taking up certain space of the recessed area. The recessed area, therefore, must be large enough for both the LED chips and the bonding wires, and the resulting lead frame package must have thick sidewalls, giving rise to the bulkiness of the conventional light-emitting devices. Furthermore, when a light-emitting device includes multiple LED chips, the heat generated by the LED chips during operation may impair the light emission efficiency and service lives of the LED chips if not properly dissipated.

In the light of the above, it is important for the related industries to develop a light-emitting device and/or an LED package structure capable of overcoming the aforesaid drawbacks.

SUMMARY

In view of the foregoing, one objective of the present invention is to provide a light-emitting device and an LED package structure, both configured to generate light of different colors or color temperatures and allow color or color temperature adjustment. Another objective of the present invention is to provide a light-emitting device and an LED package structure, both with a plurality of light-emitting units, wherein the light of each light-emitting unit is kept from inducing light from another light-emitting unit. Yet another objective of the present invention is to provide a light-emitting device and an LED package structure, both having a smaller volume than their prior art counterparts because their substrates have a smaller surface area for accommodating light-emitting units.

To achieve at least one of the aforesaid objectives, the present invention provides a light-emitting device that includes a substrate, a plurality of light-emitting units, and a sealing member. The substrate includes a plurality of electrode pads. The light-emitting units are disposed on the substrate and each include an LED chip. The LED chips are electrically connected to the electrode pads. The sealing member is also disposed on the substrate and covers a side surface of each of the light-emitting units. The sealing member includes a surrounding portion and a separating portion. The surrounding portion surrounds the light-emitting units while the separating portion is disposed between the light-emitting units.

Preferably, each of the light-emitting units of the light-emitting device includes a fluorescence layer laid over the corresponding LED chip.

Alternatively, it is preferable that one of the light-emitting units of the light-emitting device includes a fluorescence layer laid over the corresponding LED chip.

Preferably, the fluorescence layers or layer of the light-emitting device is a fluorescent adhesive patch.

Preferably, the sealing member of the light-emitting device partially covers an upper surface of one of the light-emitting units.

Preferably, each of the light-emitting units of the light-emitting device is adapted to emit outgoing light, and the outgoing light of the light-emitting units is different in wavelength or color temperature.

Preferably, the sealing member of the light-emitting device further includes a reflective substance, which turns the sealing member into a reflective component.

Preferably, one of the electrode pads of the light-emitting device is electrically connected to an electrode of each of the LED chips.

Preferably, the sealing member of the light-emitting device has an upper surface higher than or flush with an upper surface of one of the light-emitting units.

Preferably, the sealing member of the light-emitting device has an upper surface spaced apart from an upper surface of one of the light-emitting units by a distance not greater than 15% of the thickness of the fluorescence layers or layer.

Preferably, the separating portion of the sealing member of the light-emitting device has a thickness greater than half of the height of the LED chips.

Preferably, the separating portion of the sealing member of the light-emitting device includes a convex upper surface while the surrounding portion of the sealing member includes a concave upper surface.

Preferably, the convex upper surface and the concave upper surface the sealing member are spaced apart in a direction of a thickness of the fluorescence layers or of the fluorescence layer by a distance not greater than 15% of the thickness of the fluorescence layers or layer.

Preferably, the light-emitting device further includes an antistatic element. The antistatic element is disposed on the substrate, is electrically connected to the electrode pads, and is covered by the sealing member.

Preferably, each of two of the light-emitting units of the light-emitting device includes a central position, and the antistatic element also includes a central position. The central position of each of the two light-emitting units is spaced apart from the central position of the antistatic element by a first distance, and the central positions of the two light-emitting units are spaced apart from each other by a second distance greater than or equal to the first distance.

Preferably, each of two of the light-emitting units of the light-emitting device includes a central position, the antistatic element also includes a central position, the central position of each of the two light-emitting units is spaced apart from the central position of the antistatic element by a first distance, the central positions of the two light-emitting units are spaced apart from each other by a second distance, and the first distance and/or the second distance is not greater than half of the length of a side of the surrounding portion.

To achieve at least one of the aforesaid objectives, the present invention further provides an LED package structure that includes a substrate, a plurality of light-emitting units, and a sealing member. The substrate includes a plurality of electrode pads. The light-emitting units are disposed on the substrate and include a first light-emitting unit, a second light-emitting unit, a third light-emitting unit, and a fourth light-emitting unit. Each of the first to the fourth light-emitting units includes an LED chip, and the LED chips are electrically connected to the electrode pads. The sealing member is disposed on the substrate and covers a side surface of each of the first to the fourth light-emitting units. The sealing member includes a surrounding portion and a separating portion. The surrounding portion surrounds the first to the fourth light-emitting units while the separating portion is disposed between the first to the fourth light-emitting units.

Preferably, each of the first to the fourth light-emitting units of the LED package structure includes a central position, the central position of the first light-emitting unit is spaced apart from the central position of the fourth light-emitting unit by a first distance and is spaced apart from the central position of the second or the third light-emitting unit by a second distance, and the first distance is greater than the second distance.

Preferably, the first light-emitting unit of the LED package structure is adapted to emit blue outgoing light, and the fourth light-emitting unit is adapted to emit white outgoing light.

Preferably, the separating portion of the sealing member of the LED package structure has a portion that lies between the first light-emitting unit and the fourth light-emitting unit and that includes a reflective substance.

The light-emitting device and the LED package structure of the present invention can provide at least the following advantageous effects: 1) The light-emitting units can generate light of different colors or color temperatures, and the colors or color temperatures can be adjusted by controlling the time at which light of certain colors or color temperatures is generated and by mixing the color light; 2) The sealing member serves as a barrier between the light-emitting units to prevent unexpected light, which may be generated should the light of one of the light-emitting units propagate to another light-emitting unit; 3) The sealing member, which covers a portion of the upper surface of one of the light-emitting units, allows the light-emitting units to be securely disposed on the substrate as a whole or allows the fluorescence layers or layer of the light-emitting units to be securely disposed on the corresponding LED chips or chip; 4) The light-emitting units can be connected to the same electrode pad to reduce the surface areas of the electrode pads, thereby reducing the surface area of the substrate that is allocated to accommodate the light-emitting units; and 5) With the first light-emitting unit, which emits blue outgoing light, spaced apart farther from the fourth light-emitting unit, which emits white outgoing light, than from the second or the third light-emitting unit on the substrate, the blue outgoing light is kept from inducing unexpected light from the fourth light-emitting unit.

DETAILED DESCRIPTION OF THE INVENTION

Figure 1:
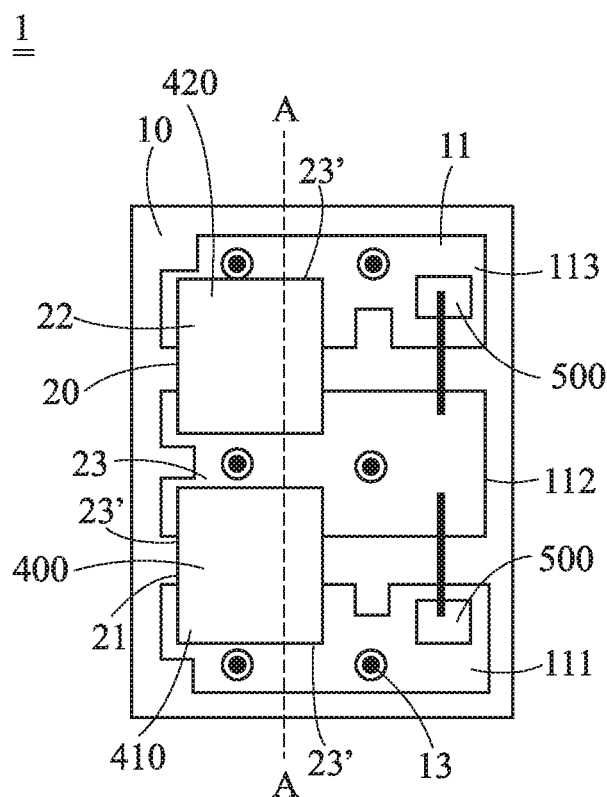
FIG. 1 is a top view of the light-emitting device in a preferred embodiment of the present invention.
Figure 2:
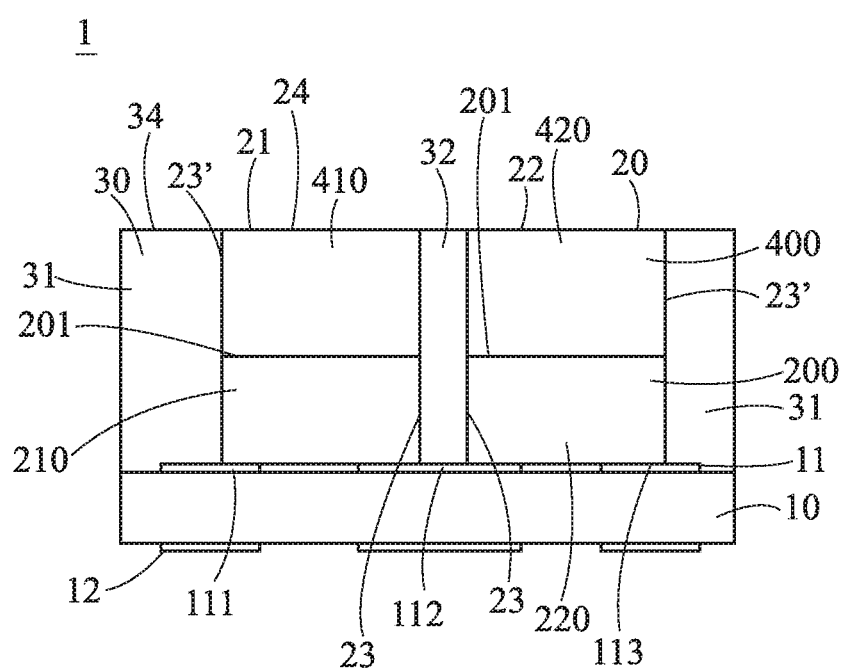
FIG. 2 is a sectional view taken along line AA in FIG. 1.

Referring to FIG. 1 and FIG. 2 for a top view and a sectional view of the light-emitting device 1 in the first preferred embodiment of the present invention respectively, the light-emitting device 1 includes a substrate 10, a plurality of light-emitting units 20, and a sealing member 30. The technical contents of these components are given below.

The substrate 10 may be a ceramic substrate, a printed circuit board, a metallic lead frame, or the like. In this embodiment, the substrate 10 is a ceramic substrate by way of example. The substrate 10 includes a plurality of electrode pads 11 disposed on an upper surface of the substrate 10. The electrode pads 11, therefore, can be referred to as the upper electrode pads. In this embodiment, there are three electrode pads 11 by way of example, and to facilitate description, the three electrode pads 11 are indicated by reference numerals 111, 112, and 113 respectively. The substrate 10 further includes a plurality of electrode pads 12 and a plurality of conducting vias 13. The electrode pads 12 are disposed on a lower surface of the substrate 10 (and can therefore be referred to as the lower electrode pads). The conducting vias 13 are disposed between the upper surface and the lower surface of the substrate 10 and are each in contact with the corresponding electrode pads 11 and 12 to electrically connect the corresponding electrode pads 11 and 12. In this embodiment, the number of the electrode pads 12 corresponds to that of the electrode pads 11 (i.e., three). In other embodiments (not shown), there may be two electrode pads 12 (i.e., one less than the electrode pads 11), wherein one of the electrode pads 12 is electrically connected with two electrode pads 11 while the other electrode pad 12 is electrically connected with one electrode pad 11. The electrode pads 11 may extend to and be exposed on a side surface of the substrate 10 (not shown), and in that case, both the electrode pads 12 and the conducting vias 13 can be dispensed with.

The light-emitting units 20 are disposed on the substrate 10. Two light-emitting units 20 are provided in this embodiment by way of example and are referred to as the first light-emitting unit 21 and the second light-emitting unit 22 respectively. Each of the light-emitting units 21 and 22 includes an LED chip 200, and the two LED chips are identified as a first LED chip 210 and a second LED chip 220 respectively. The LED chips 210 and 220 may have a horizontal, vertical, or flip-chip structure and in this embodiment are both flip chips. The light emitted by the LED chips 210 and 220 may have the same color or different colors. For instance, the LED chips 210 and 220 are both configured to emit blue light having a main-peak wavelength ranging from 420 nm to 490 nm.

In order to reduce the volume of the package and the number of electrodes while allowing individual adjustment of the LED chips, the two electrodes (i.e., the cathode and the anode) of the first LED chip 210 are electrically connected to the electrode pads 111 and 112 of the substrate 10 respectively, and the two electrodes (i.e., the anode and the cathode) of the second LED chip 220 are electrically connected to the electrode pads 112 and 113 respectively. Please note that the electrode pad 112 in the middle is electrically connected to the anodes of both LED chips 210 and 220 to form common-anode electrical connection. This configuration makes it possible to electrically connect the two LED chips 210 and 220 via only three electrode pads, namely 111~113, and thereby reduce the surface area of the upper surface of the substrate 10 that is required for the electrical connection. In other embodiments, the two LED chips 210 and 220 may adopt co-cathode electrical connection instead or be electrically independent from each other (i.e., without a common anode or cathode); in the latter case, there may be four electrode pads 11. Please note that the common-anode or common-cathode arrangement is intended to downsize the resulting package, and that therefore the electrode pad 112 serving as the common anode or cathode is provided at a central portion of the package while the other electrode pads 111 and 113 are disposed on two lateral sides of the common anode or cathode respectively.

Each of the light-emitting units 21 and 22 further includes a fluorescence layer 400, and the two fluorescence layers are referred to as a first fluorescence layer 410 and a second fluorescence layer 420 respectively. The first fluorescence layer 410 is laid over the first LED chip 210, and the second fluorescence layer 420, over the second LED chip 220. The first and the second fluorescence layers 410 and 420 may have different wavelength conversion effects; in other words, the fluorescence layers 410 and 420 may have different phosphor powder compositions or different phosphor powder concentrations such that the color temperature of the outgoing light of the first light-emitting unit 21 is different from that of the second light-emitting unit 22. For example, the outgoing light of the first light-emitting unit 21 is preferably white light having a color temperature of about 2600 K to 3200 K, and the outgoing light of the second light-emitting unit 22 is preferably white light having a color temperature of about 5500 K to 6500 K.

Figure 3:
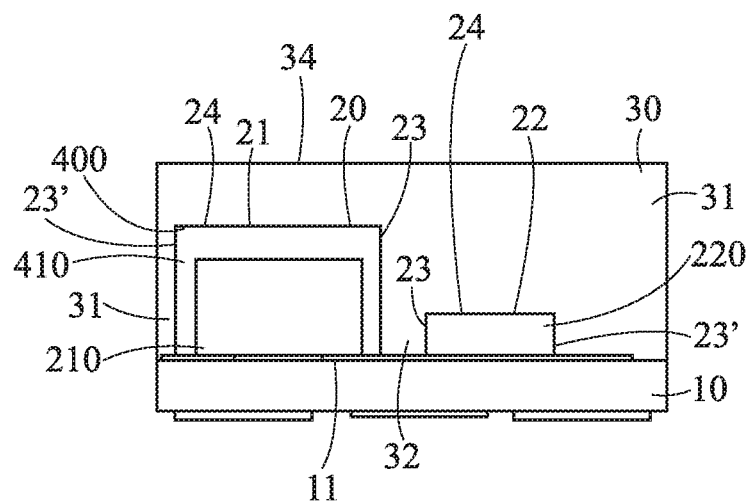
FIG. 3 is a side view of a variation of the light-emitting device in FIG. 1, with the second light-emitting unit lacking a fluorescence layer.

In another embodiment as shown in FIG. 3, only the first light-emitting unit 21 includes the fluorescence layer 400; the second light-emitting unit 22 includes only the second LED chip 220. Thus, the light emitted by the first light-emitting unit 21 is a mixture of the light of the first LED chip 210 and the light converted by the fluorescence layer 400 from the light of the first LED chip 210, and the light emitted by the second light-emitting unit 22 is the light of the second LED chip 220 and is different in color from the light emitted by the first light-emitting unit 21. For example, the outgoing light of the first light-emitting unit 21 is white light having a color temperature of about 5500 K to 6500 K (cold white light), and the outgoing light of the second light-emitting unit 22 is blue light (with a main-peak wavelength of about 420 nm to 490 nm), green light, yellow light, orange light, or red light (with a main-peak wavelength of about 625 nm).

Referring back to FIG. 1 and FIG. 2, the fluorescence layers 400 include a matrix and a fluorescence substance. The matrix may by a ceramic material (preferably silicon dioxide) or a resin (preferably epoxy or silicone). The fluorescence substance may be one or more selected from the group consisting of: $(Sr,Ba)Si_2(O,Cl)_2N_2:Eu^{2+}$; $Sr_5(PO_4)_3$ $Cl:Eu^{2+}$; $(Sr,Ba)MgAl_{10}O_{17}:Eu^{2+}$; $(Sr,Ba)_3MgSi_2O_8:Eu^{2+}$; $SrAl_2O_4:Eu^{2+}$; $SrBaSiO_4:Eu^{2+}$; $CdS:In$; $CaS:Ce^{3+}$; $(Y,Lu,Gd)_3(Al,Ga)_5O_{12}:Ce^{3+}$; $Ca_3Sc_2Si_3O_{12}:Ce^{3+}$; $SrSiON:Eu^{2+}$; $ZnS:Al^{3+},Cu^+$; $CaS:Sn^{2+}$; $CaS:Sn^{2+},F$; $CaSO_4:Ce^{3+},Mn^{2+}$; $LiAl$ $O_2:Mn^{2+}$; $BaMgAl_{10}O_{17}:Eu^{2+}$, $Mn^{2+}$; $ZnS:Cu^+,Cl^-$; $Ca_3WO_6:U$; $Ca_3SiO_4Cl_2:Eu^{2+}$; $Sr_xBa_yCl_zAl_2O_{4-z/2}:Ce^{3+},Mn^{2+}$ (x:0.2; y:0.7; z:1.1); $Ba_2MgSi_2O_7:Eu^{2+}$; $Ba_2SiO_4:Eu^{2+}$; $Ba_2Li_2Si_2O_7:Eu^{2+}$; $ZnO:S$; $ZnO:Zn$; $Ca_2Ba_3(PO_4)_3Cl:Eu^{2+}$; $BaAl_2O_4:Eu^{2+}$; $SrGa_2S_4:Eu^{2+}$; $ZnS:Eu^{2+}$; $Ba_5(PO_4)_3$ $Cl:U$; $Sr_3WO_6:U$; $CaGa_2S_4:Eu^{2+}$; $SrSO_4:Eu^{2+},Mn^{2+}$; $ZnS:P$; $ZnS:P^{3-},Cl^-$; $ZnS:Mn^{2+}$; $CaS:Yb^{2+},Cl$; $Gd_3Ga_4O_{12}:Cr^{3+}$; $CaGa_2S_4:Mn^{2+}$; $Na(Mg,Mn)_2LiSi_4O_{10}F_2:Mn$; $ZnS:Sn^{2+}$; $Y_3Al_5O_{12}:Cr^{3+}$; $SrB_8O_{13}:Sm^{2+}$; $MgSr_3Si_2O_8:Eu^{2+},Mn^{2+}$; $\alpha\text{-}SrO.3B_2O_3:Sm^{2+}$; $ZnS\text{---}CdS$; $ZnSe:Cu^+,Cl$; $ZnGa_2S_4:Mn^{2+}$; $ZnO:Bi^{3+}$; $BaS:Au,K$; $ZnS:Pb^{2+}$; $ZnS:Sn^{2+},Li^+$; $ZnS:Pb,Cu$; $CaTiO_3:Pr^{3+}$; $CaTiO_3:Eu^{3+}$; $Y_2O_3:Eu^{3+}$; $(Y,Gd)_2O_3:Eu^{3+}$; $CaS:Pb^{2+},Mn^{2+}$; $YPO_4:Eu^{3+}$; $Ca_2MgSi_2O_7:Eu^{2+},Mn^{2+}$; $Y(P,V)O_4:Eu^{3+}$; $Y_2O_2S:Eu^{3+}$; $SrAl_4O_7:Eu^{3+}$; $CaYAlO_4:Eu^{3+}$; $LaO_2S:Eu^{3+}$; $LiW_2O_8:Eu^{3+},Sm^{3+}$; $(Sr,Ca,Ba,Mg)_{10}(PO_4)_6Cl_2:Eu^{2+}$, $Mn^{2+}$; $Ba_3MgSi_2O_8$: $Eu^+,Mn^{2+}$; $ZnS:Mn^{2+},Te^{2+}$; $Mg_2TiO_4:Mn^{4+}$; $K_2SiF_6:Mn^{4+}$; $Na_{1.23}K_{0.42}Eu_{0.12}TiSi_4O_{11}$; $Na_{1.23}K_{0.42}Eu_{0.12}TiSi_5O_{13}:Eu^{3+}$; $CdS:In,Te$; $(Sr,Ca)AlSiN_3:Eu^{2+}$; $CaSiN_3:Eu^{2+}$; $(Ca,Sr)_2Si_5N_8:Eu^{2+}$; and $Eu_2W_2O_7$.

The fluorescence layers 400 may include the aforesaid fluorescence substances at different percentages. For example, the first fluorescence layer 410 includes a first yellow-green fluorescence substance and a first red fluorescence substance at unequal proportions: taking the weight of the matrix as 100 portions, the weight of the first yellow-green fluorescence substance is about 90 to 120 portions, and the weight of the first red fluorescence substance is about 5 to 15 portions. The second fluorescence layer 420, on the other hand, includes a second yellow-green fluorescence substance and a second red fluorescence substance, in which, taking the weight of the matrix as 100 portions, the weight of the second yellow-green fluorescence substance is about 20 to 60 portions while the weight of the second red fluorescence substance is about 1 to 10 portions. In some embodiments, the first fluorescence layer 410 may include, taking the weight of its matrix as 100 portions, a first yellow-green fluorescence substance whose weight is about 20 to 60 portions and a first red fluorescence substance whose weight is about 1 to 10 portions; and the second fluorescence layer 420 may include, taking the weight of its matrix as 100 portions, only a blue fluorescence substance whose weight is about 1 to 20 portions.

The fluorescence layers 400 may be provided as fluorescent adhesive patches, laid over the LED chips 200 respectively, or be formed directly on the LED chips 200 by spray coating, screen printing, dispensing, laminating, or molding, for example.

When fluorescent adhesive patches are used as the fluorescence layers 400, the fluorescence substances in the patches may be distributed unevenly within the patches. For example, when the fluorescent adhesive patches are formed by molding, the concentration of fluorescence substances will be higher on one side of each patch than on the opposite side; consequently, the former side is smoother, and less rough, than the latter side. Once the high-concentration sides of such fluorescent adhesive patches are adhesively attached to the upper surfaces 201 of the LED chips 200 respectively (that is to say, with the low-concentration sides facing outward), the less smooth, or the rougher, surfaces of the patches can reduce light reflection, thus increasing light emission efficiency of the light-emitting device 1. If, conversely, the low-concentration sides of such fluorescent adhesive patches are adhesively attached to the upper surfaces 201 of the LED chips 200 respectively (that is to say, with the high-concentration sides facing outward), the light-emitting device 1 will have a smoother look.

The shapes of the fluorescent adhesive patches may vary with those of the upper surfaces 201 of the LED chips 200. For example, rectangular patches are used when the upper surfaces 201 of the LED chips 200 are rectangular. In addition, the outer sides of the fluorescent adhesive patches may tilt at different angles to help secure the patches by reinforcing the bond between the patches and the sealing member 30 of the light-emitting device 1.

Moreover, the light-emitting units 20, each composed of an LED chip 200 and a fluorescence layer 400, may be disposed on the substrate 10 in various ways. For instance, the fluorescence layers 400 may be laid over the LED chips 200 respectively to form the light-emitting units 20 first, and the light-emitting units 20 are subsequently disposed on the substrate 10 by a "pick up and place" method or by batch transfer. Alternatively, the light-emitting units 20 may be gradually formed on the substrate 10 by, for example, bonding the bare LED chips 200 to the substrate 10 and then laying the fluorescence layers 400 over some or all of the LED chips 200 respectively, using a "pick up and place" method. Before a fluorescence layer 400 is placed on an LED chip 200, the LED chip 200 may be provided with some transparent adhesive (not shown); for example, the transparent adhesive may be applied to the LED chip 200 by dispensing. After that, the fluorescence layer 400 is placed on and thus secured to the LED chip 200. The transparent adhesive covers at least the entire upper surface 201 of the LED chip 200 (or the transparent adhesive may also cover some side surface portions of at least some of the LED chips 200). Preferably, the upper surface 24 of each light-emitting unit 20 (i.e., the upper surface of each fluorescence layer 400) is level.

The sealing member 30 is adapted to seal the peripheries of the light-emitting units 20 and of other internal components (e.g., the electrode pads 11) of the light-emitting device 1 so as to protect those components against environmental hazards and from damage by an external force. More specifically, the sealing member 30 is disposed on the substrate 10 and covers the side surfaces 23 of each light-emitting unit 20, even covering the upper surface of the substrate 10 and the electrode pads 11 but not the electrode pads 12. The sealing member 30 includes a surrounding portion 31 and a separating portion 32. The separating portion 32 is disposed between the first light-emitting unit 21 and the second light-emitting unit 22 and covers the opposing side surfaces 23 (i.e., the inner side surfaces) of the two light-emitting units 21 and 22; in other words, the first and the second light-emitting units 21 and 22 are separated by the separating portion 32. The surrounding portion 31, on the other hand, surrounds the non-opposing side surfaces 23' (i.e., the outer side surfaces) of the first and the second light-emitting units 21 and 22. The sealing member 30 may be formed by a dispensing, mold pressing, or spray coating process for example.

The sealing member 30 preferably includes a reflective substance such as titanium dioxide, boron nitride, or zirconia in order to serve as a reflective component, in which case the sealing member 30 preferably covers the side surfaces 23 and 23' of the light-emitting units 20 in their entirety so that the light of each of the first light-emitting unit 21 and the second light-emitting unit 22 is kept from reaching the other light-emitting unit through the sealing member 30, lest the second fluorescence layer 420 or the first fluorescence layer 410 be excited and generate light as a result (i.e., lest the light-emitting units 20 interfere with each other), the goal being to prevent either of the first light-emitting unit 21 and the second light-emitting unit 22 from being excited by the other light-emitting unit and generating unexpected light when the latter light-emitting unit is activated to emit light.

To further prevent interference of light between the light-emitting units 21 and 22, the thickness of the separating portion 32 (i.e., the shortest distance between the side surfaces 23 of the first light-emitting unit 21 and of the second light-emitting unit 22) is preferably greater than half of the height of the LED chips 200 but not greater than the shortest distance between the outer side surfaces (i.e., the side surfaces 23') of the LED chips 200 and the outer side surfaces of the light-emitting device 1 (i.e., the outer side surfaces of the sealing member 30). This allows the reflective substance in the separating portion 32 to be dense enough to reflect outward the light of the light-emitting units 21 and 22 without causing interference between the light-emitting units 21 and 22. In one embodiment, the thickness of the separating portion 32 is 160 μm.

Figure 4:
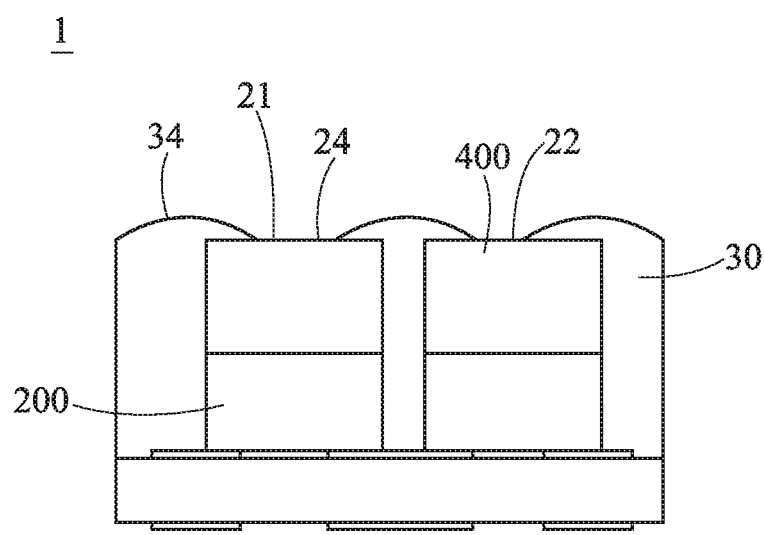
FIG. 4 is a side view of another variation of the light-emitting device in FIG. 1, with the sealing member partially covering the upper surface of the first light-emitting unit and the upper surface of the second light-emitting unit.

Preferably, referring to FIG. 4, the sealing member 30 is slightly higher than the fluorescence layers 400 and partially covers the upper surfaces 24 of the light-emitting units 21 and 22 (i.e., the upper surfaces of the fluorescence layers 400) to produce a securing effect. In other words, in addition to the side surfaces 23 and 23', the sealing member 30 may cover at least some peripheral portions of the upper surfaces 24 so that the fluorescence layers 400 will not separate from the LED chips 200 when expanded under heat. Moreover, in order not to produce any adverse effect on the light pattern of the light-emitting device 1, the distance (i.e., the difference in height) between the upper surface 34 of the sealing member 30 and the upper surfaces 24 of the light-emitting units 20 is not greater than, and is preferably smaller than, 15% of the thickness of the fluorescence layers 400. This arrangement allows the sealing member 30 to hold the fluorescent adhesive patches (i.e., the fluorescence layers 400) in place without affecting the light pattern.

Figure 5:
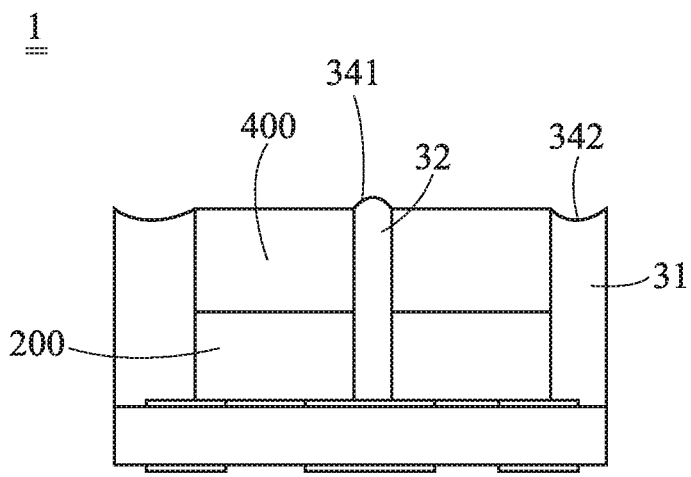
FIG. 5 is a side view of yet another variation of the light-emitting device in FIG. 1, with the separating portion having a convex upper surface and the surrounding portion having a concave upper surface.

Referring to FIG. 5, the upper surface 34 of the sealing member 30 may have a curved cross-sectional contour, either convex or concave. More specifically, the upper surface of the separating portion 32 may form a convex upper surface 341, and the upper surface of the surrounding portion 31, a concave upper surface 342. The height difference between the highest point of the convex upper surface 341 and the lowest point of the concave upper surface 342 is preferably not greater than 15% of the thickness of the fluorescence layers 400 so that the sealing member 30 can secure the fluorescence layers 400 without compromising the light pattern of the light-emitting device 1.

Referring back to FIG. 2, the upper surface 34 of the sealing member 30 may also be flush, or coplanar, with the upper surfaces 24 of the first and the second light-emitting units 21 and 22. Or, as shown in FIG. 3, the sealing member 30 may cover the upper surfaces 24 and side surfaces 23 and 23' of the first and the second light-emitting units 21 and 22 completely, in which case the sealing member 30 is light-permeable (i.e., does not contain any reflective substance) at least in the portion lying above the upper surfaces 24, in order for the light generated by the light-emitting units 21 and 22 to pass through the sealing member 30.

Referring back to FIG. 1, the light-emitting device 1 may further include one or a plurality of antistatic elements 500 disposed on the substrate 10. In this embodiment, two antistatic elements 500 are provided by way of example and correspond to the first light-emitting unit 21 and the second light-emitting unit 22 respectively. To provide antistatic protection for the light-emitting units 21 and 22, one of the antistatic elements 500 is electrically connected to the electrode pads 111 and 112 and thereby parallel-connected to the first light-emitting unit 21, and the other antistatic element 500 is electrically connected to the electrode pads 113 and 112 and thereby parallel-connected to the second light-emitting unit 22. The antistatic elements 500 may be covered by the surrounding portion 31 of the sealing member 30; in other words, manufacture of the light-emitting device 1 may include disposing the antistatic elements 500 on the substrate 10 and then covering the antistatic elements 50 completely with the sealing member 30 to prevent exposure of the antistatic elements 500 from the light-emitting device 1. Each antistatic element 500 may be a Zener diode or any one selected from the group consisting of a varistor, a multilayer varistor (MLV), a polymer electrostatic discharge (PESD) suppressor, and a transient voltage suppressor (TVS).

The technical contents of the light-emitting device 1 are described in more detail below with reference to some practical examples.

Example 1 (see FIG. 1 and FIG. 2)

To start with, the first and the second fluorescence layers 410 and 420 were formed. More specifically, 100 portions by weight of silicone were mixed with 105 portions by weight of $Y_3(Al,Ga)_5O_{12}:Ce^{3+}$ and 14 portions by weight of $(Sr,Ca)AlSiN_3:Eu^{2+}$. The mixture was molded at 130° C. for 5 minutes and then baked in stages (e.g., the first stage being baking at 80° C. for 60 minutes, followed by baking at 120° C. for 60 minutes and then at 180° C. for 120 minutes) to form a fluorescent adhesive patch having a thickness of about 160 μm as the first fluorescence layer 410. Using the same molding conditions, but changing the proportions of the ingredients to 100 portions by weight of silicone mixed with 36 portions by weight of $Y_3(Al,Ga)_5O_{12}:Ce^{3+}$ and 4 portions by weight of $(Sr,Ca)AlSiN_3:Eu^{2+}$, another fluorescent adhesive patch having a thickness of about 160 μm was formed as the second fluorescence layer 420.

Next, the substrate 10 was provided, and two blue LED flip chips of the same wavelength of 450 nm were provided as the first and the second LED chips 210 and 220 and were bonded to the substrate 10 by a direct bonding process. Two Zener diodes serving as the antistatic elements 500 were then bonded to the two outer electrode pads 111 and 113 respectively and were each electrically connected to the middle electrode pad 112 by a wire.

Following that, the low-concentration side of the first fluorescence layer 410 was adhesively attached to the first LED chip 210 to form the first light-emitting unit 21, and the low-concentration side of the second fluorescence layer 420 was adhesively attached to the second LED chip 220 to form the second light-emitting unit 22. Both the first and the second fluorescence layers 410 and 420, therefore, had their high-concentration sides facing up, and the upper surfaces of the fluorescence layers were of substantially the same height (i.e., flush with each other). Then, by a molding process (at 130° C. for 5 minutes), a silicone composition containing a reflective substance was filled in between and around the first and the second LED chips 210 and 220 to form the sealing member 30, which contained the reflective substance. The sealing member 30 covered the antistatic elements 500 completely and was about 20 μm higher than the upper surfaces of the first and the second fluorescence layers 410 and 420, wherein the height difference is approximately 12.5% of the thickness of the first and the second fluorescence layers 410 and 420. After that, the sealing member 30 was subjected to multistage baking (e.g., sequentially at 80° C., 120° C., and 180° C. for 60 minutes, 60 minutes, and 120 minutes, respectively) until solidified. The sealing member 30 and the substrate 10 were then cut with a diamond cutter to form a singulated light-emitting device 1. Once the light-emitting device 1 was lit, the first light-emitting unit 21 emitted white light having a color temperature of about 2700 K while the second light-emitting unit 22 emitted white light having a color temperature of about 5800 K.

Example 2 (see FIG. 1 and FIG. 2)

The operation parameters in example 1 were repeated except for the compositions and concentrations of the fluorescence substances in the fluorescence layers 400. More specifically, the first fluorescence layer 410 included 100 portions by weight of silicone, 36 portions by weight of $Y_3(Al,Ga)_5O_{12}:Ce^{3+}$, and 4 portions be weight of $(Sr,Ca)AlSiN_3:Eu^{2+}$; and the second fluorescence layer 420 included 100 portions by weight of silicone and 9 portions by weight of $BaSi_2(O,Cl)_2N_2:Eu^{2+}$. By repeating the steps of example 1, another singulated light-emitting device 1 was obtained. Once this light-emitting device 1 was lit, its first light-emitting unit 21 emitted white light having a color temperature of about 5800 K while its second light-emitting unit 22 emitted blue light, which was a mixture of light having a main-peak wavelength of 450 nm (i.e., the light of the second LED chip 220) and light having a main-peak wavelength of 470 nm (i.e., the light generated by exciting the second fluorescence layer 420).

It was found that the light-emitting units 20 in both examples had low light emission efficiency. This is probably because the upper surfaces of the fluorescence layers 400 were covered excessively with the resin of the sealing member 30. To solve this problem, an organic solvent can be used to clean off (i.e., remove) the excess resin before the cutting step begins.

Figure 6A:
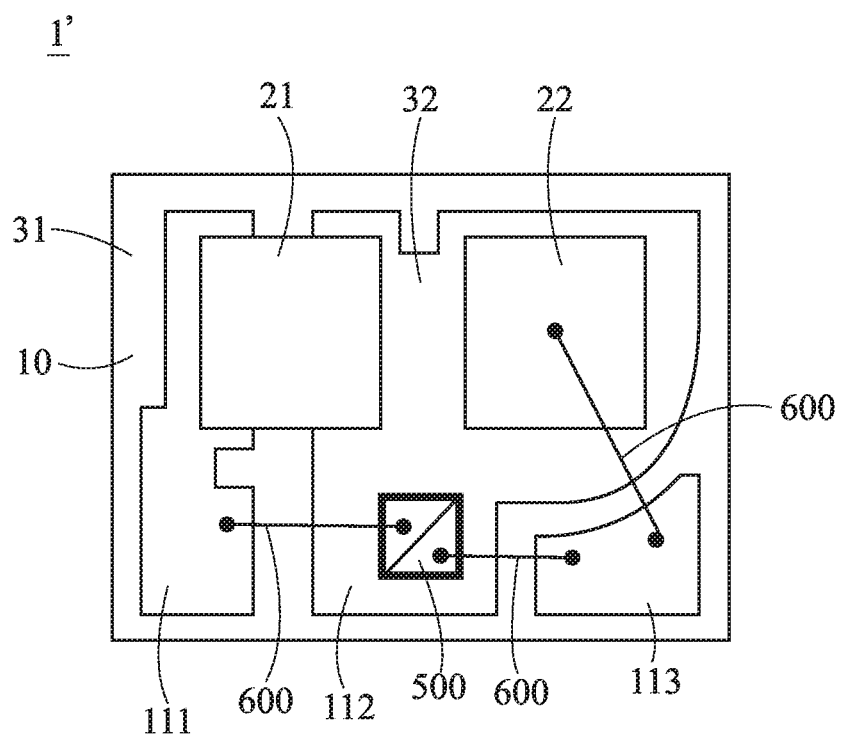
FIG. 6A is a top view of the light-emitting device in a second preferred embodiment of the present invention.
Figure 6B:
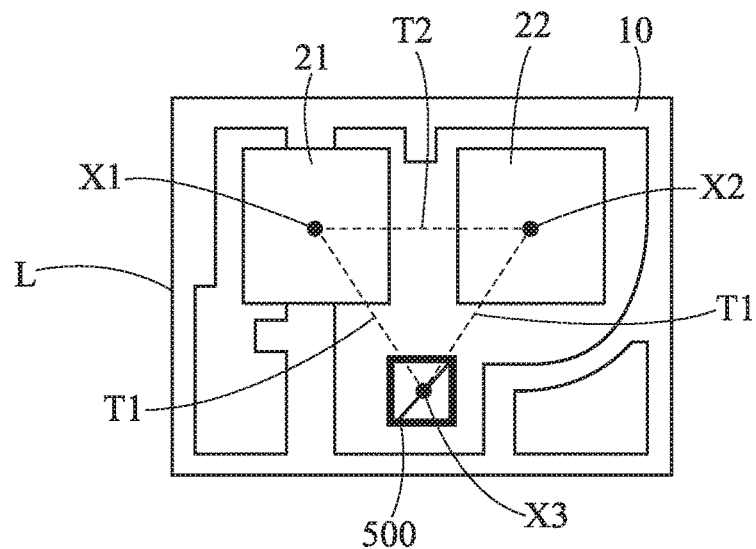
FIG. 6B is another top view of the light-emitting device in FIG. 6A.

FIG. 6A and FIG. 6B are top view of the light-emitting device 1' in the second preferred embodiment of the present invention respectively. The light-emitting device 1' is similar in construction to the light-emitting device 1, so the technical contents of the former can be cross-referenced to those of the latter. In the light-emitting device 1', electrical connection between the first light-emitting unit 21, the second light-emitting unit 22, and the substrate 10 may involve a common anode (or common cathode). The first light-emitting unit 21 includes an LED chip 210 and a fluorescence layer 400 (as shown in FIG. 3), wherein the LED chip 210 is a flip chip configured for a main-peak wavelength of 450 nm (blue light) and has two electrodes bonded respectively to the left electrode pad 111 and the middle electrode pad 112, and wherein the fluorescence layer 400 includes 100 portions by weight of silicone and 150 portions by weight of $Y_3Al_5O_{12}:Ce^{3+}$ such that the first light-emitting unit 21 as a whole can emit white light having a color temperature of about 5800 K. The second light-emitting unit 22 includes an LED chip 220 (as shown in FIG. 3), which is a vertically structured chip configured for a main-peak wavelength of 625 nm (red light) and having its anode facing down and cathode facing up, the anode being bonded to the middle electrode pad 112, with a wire 600 electrically connecting the chip to the right electrode pad 113.

The light-emitting device 1' includes only one antistatic element 500 (e.g., a Zener diode), which includes a plurality of P-N junctions sharing a common anode but having their respective cathodes. The antistatic element 500 is disposed on the substrate 10, with the common anode electrically connected to the middle electrode pad 112, and with the cathodes electrically connected by wires 600 to the two lateral electrode pads 111 and 113 respectively. Thus, only one antistatic element 500 suffices to electrically connect, and thereby protect, the light-emitting units 21 and 22, and the number of components is effectively reduced. Preferably, the antistatic element 500 is located opposite the light-emitting units 21 and 22 and corresponds to the gap (i.e., the separating portion 32) between the light-emitting units 21 and 22; otherwise, the wire 600 between the antistatic element 500 and the electrode pad 113 may be so close to the wire 600 between the electrode pad 113 and the light-emitting unit 22 that a short circuit is formed between the light-emitting unit 22 and the antistatic element 500.

Furthermore, referring to FIG. 6B, the first and the second light-emitting units 21 and 22 include central positions X1 and X2 respectively (which are the centroids of their respective upper surfaces), and the antistatic element 500 includes a central position X3. The central position X1 is spaced apart from the central position X3 by a first distance T1. The central position X2 is spaced apart from the central position X3 also by the first distance T1. That is to say, the distance between the central positions X1 and X3 is equal to that between the central positions X2 and X3. On the other hand, the central positions X1 and X2 are spaced apart from each other by a second distance T2, which is preferably greater than or equal to the first distance T1 so that lines interconnecting the central positions X1~X3 form an isosceles triangle or equilateral triangle, allowing the outgoing light of the first light-emitting unit 21 and of the second light-emitting unit 22 to be projected onto a horizontal line.

Besides, the first distance T1 or the second distance T2 is preferably not greater than half of the length of any sidewall of the light-emitting device 1'. For example, if the surrounding portion 31 has a side of a length L, the first distance T1 or the second distance T2 is not greater than half of the length L. This ensures that the antistatic element 500 and the light-emitting units 21 and 22 are disposed on the substrate 10 in a compact configuration that enables reduction of the surface area of the upper surface of the substrate 10.

Having disclosed the technical contents of the light-emitting devices 1 and 1', this specification continues on to the technical contents of the LED package structure 2 in the third preferred embodiment of the present invention, wherein the latter technical contents can be cross-referenced to the former.

Figure 7:
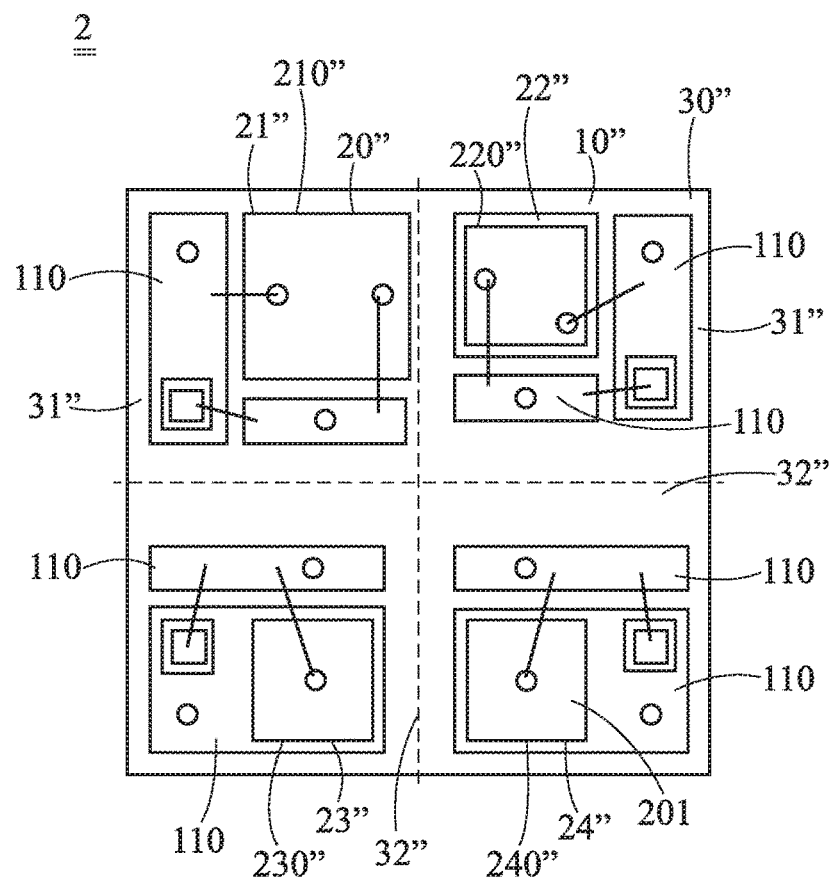
FIG. 7 is a top view of the LED package structure in a third preferred embodiment of the present invention.
Figure 8:
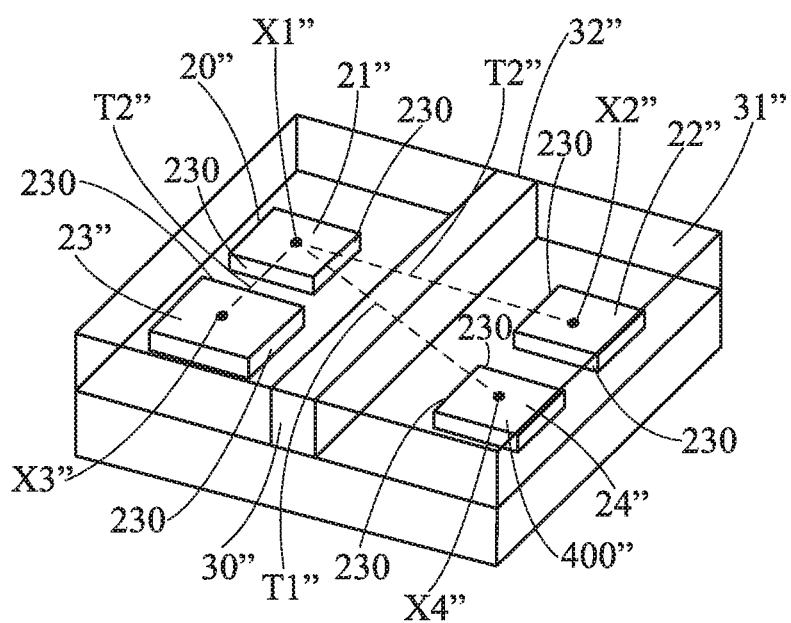
FIG. 8 is a perspective view of the LED package structure in FIG. 7.

Referring to FIG. 7 and FIG. 8, the LED package structure 2 can be viewed as a combination of two light-emitting devices 1, of two light-emitting devices 1', or of a light-emitting device 1 and a light-emitting device 1'; the present invention has no limitation on such combinations. The LED package structure 2 includes a substrate 10", a plurality of light-emitting units 20", and a sealing member 30". A plurality of (eight, for example) electrode pads 110 are disposed on the substrate 10" in pairs, each pair electrically connected to one of the first to the fourth light-emitting units 21"~24". If common-anode/common-cathode electrical connection is used, only six electrode pads 110 are needed to electrically connect the substrate 10" to the light-emitting units 21"~24". Each of the first to the fourth light-emitting units 21"~24" includes an LED chip, and the four LED chips are identified as the first to the fourth LED chips 210", 220", 230", and 240" respectively. The first and the second LED chips 210" and 220" may have a horizontal structure while the third and the fourth LED chips 230" and 240" have a vertical structure. The first to the fourth LED chips 210"-240" may be flip chips instead.

The first to the fourth LED chips 210"-240" may be configured to emit visible light (e.g., blue, green, orange, or yellow light) or invisible light (e.g., ultraviolet or infrared light). In order to produce light of high color saturation and of a high color rendering index, the first to the fourth LED chips 210"-240" in this embodiment may be an RGB LED chip combination for emitting red light, green light, and blue light; an RGBW LED chip combination for emitting red light, green light, blue light, and white light; an RGBO LED chip combination for emitting red light, green light, blue light, and orange light; or an RGBY LED chip combination for emitting red light, green light, blue light, and yellow light. By regulating the electric current supplied to the first to the fourth LED chips 210"-240", the desired white balance and brightness can be achieved.

Take an RGBW or RGBY LED chip combination for example. The first to the fourth light-emitting units 21"-24" may be arranged in a rectangular array, with the first and the fourth LED chips 210" and 240" being blue LED chips, the fourth LED chip 240" covered with a fluorescence layer 400", and the second and the third LED chips 220" and 230" being a red LED chip and a green LED chip respectively. The first to the third light-emitting units 21"~23", which do not have any fluorescence layer, can emit blue outgoing light, red outgoing light, and green outgoing light respectively. The fourth light-emitting unit 24" can emit either white or yellow outgoing light, depending on the type(s) and composition(s) of the fluorescence substance(s) in the fluorescence layer 400". The fluorescence substance(s) may be prepared from garnet powder, nitride powder, silicate powder, KSF ($K_2SiF_6:Mn^{4+}$ powder, SiAlON powder, and so on, according to the desired wavelength of light. The garnet powder may be yttrium aluminum garnet (YAG)-based phosphor powder, in which yttrium (Y) may be substituted with at least one element selected from the group consisting of Tb, Lu, Gd, La, Sc, and Sm, and in which aluminum (A) may be substituted with at least one element selected from the group consisting of Ga and In. The nitride powder may be CASN or SCASN. To form the fluorescence layer 400", the fourth LED chip 240" may be spray-coated selectively from above via a mask with an opening corresponding in size to the fourth LED chip 240".

When the first light-emitting unit 21" is lit, the blue light it emits may excite the fluorescence layer 400" of the fourth light-emitting unit 24" such that white or yellow outgoing light is generated and alters the color of the blue light. To mitigate or eliminate this problem, it is feasible to place the first and the fourth light-emitting units 21" and 24" diagonally to increase the distance (i.e., the first distance T1") therebetween. That is to say, with the first to the fourth light-emitting units 21"~24" having central positions X1"~X4" respectively, the first distance T1", which is defined between the central positions X1" and X4", can be made greater than the second distance T2", which is defined between the central positions X1" and X3" as well as between the central positions X1" and X2".

The aforesaid blue light color shift can also be addressed by rendering the portion of the sealing member 30" that covers the first and the fourth light-emitting units 21" and 24" either opaque or highly reflective. More specifically, the sealing member 30" includes a surrounding portion 31" and a separating portion 32". The separating portion 32" is disposed between the first to the fourth light-emitting units 21"~24" and covers two corresponding pairs of side surfaces 230 of the first to the fourth light-emitting units 21"~24". The surrounding portion 31" surrounds the first to the fourth light-emitting units 21"~24". At least the separating portion 32", which lies between the first and the fourth light-emitting units 21" and 24", (or at least the portion of the separating portion 32" that lies between the first and the fourth light-emitting units 21" and 24") may contain an opaque substance or a reflective substance having a reflectivity higher than 50% (e.g., titanium dioxide, boron nitride, and/or zirconia) in order to function as a barrier for preventing the blue outgoing light emitted by the first light-emitting unit 21" from reaching the fourth light-emitting unit 24".

The first to the fourth LED chips 210"~240" may be connected to separate light sources (not shown) respectively so as to be turned on and off independently. In that case, the first to the fourth LED chips 210"~240" can be lit all at once or only partially to enable modulation of the color or color temperature (e.g., 2200~3500 K) of the light emitted. The power sources may work in conjunction with a wired or wireless smart light modulation system to achieve the desired lighting effects, wherein the term "wireless" refers to control via infrared light, radio-frequency (RF) signals, GPRS (General Packet Radio Service)/CDMA (Code Division Multiple Access), Wi-Fi, or ZigBee, for example.

In summary, the light-emitting device and the LED package structure of the present invention can generate light of different colors or color temperatures and allow adjustment in color or color temperature of the light emitted. Moreover, the light emitted by each light-emitting unit is kept from inducing unwanted light from another light-emitting unit, and the surface area of the substrate that is occupied by the light-emitting units is reduced to help downsize the entire device or package structure.

The embodiments described above serve only to demonstrate how the present invention can be implemented and to shed light on the technical features of the invention. The embodiments are not intended to restrict the scope of patent protection sought by the applicant, which scope is defined by the appended claims. All changes or equivalent arrangements easily conceivable by a person skilled in the art should fall within the scope of the invention.

What is claimed is:

1. A light-emitting device, comprising:
a substrate comprising a plurality of electrode pads;
a plurality of light-emitting units disposed on the substrate, wherein each of the light-emitting units comprises a light-emitting diode (LED) chip, and the LED chips are electrically connected to the electrode pads; and
a sealing member disposed on the substrate and covering a side surface of each of the light-emitting units, wherein the sealing member comprises a surrounding portion and a separating portion, the surrounding portion surrounds the light-emitting units, and the separating portion is disposed between the light-emitting units,
wherein the separating portion of the sealing member comprises a convex upper surface, and the surrounding portion of the sealing member comprises a concave upper surface.

2. The light-emitting device of claim 1, wherein each of the light-emitting units comprises a fluorescence layer laid over a corresponding one of the LED chips.

3. The light-emitting device of claim 2, wherein at least one of the fluorescence layer of each of the plurality of light-emitting units is a fluorescent adhesive patch.

4. The light-emitting device of claim 2, wherein the sealing member has an upper surface spaced apart from an upper surface of one of the light-emitting units by a distance not greater than 15% of a thickness of at least one of the fluorescence layer of each of the plurality of light-emitting units.

5. The light-emitting device of claim 1, wherein one of the light-emitting units comprises a fluorescence layer laid over a corresponding one of the LED chips.

6. The light-emitting device of claim 1, wherein each of the light-emitting units is adapted to emit outgoing light, and the outgoing light of the light-emitting units varies in wavelength or color temperature.

7. The light-emitting device of claim 1, wherein the sealing member further comprises a reflective substance and therefore serves as a reflective component.

8. The light-emitting device of claim 1, wherein one of the electrode pads is electrically connected to an electrode of each of the LED chips.

9. The light-emitting device of claim 1, wherein the sealing member has an upper surface higher than or flush with an upper surface of one of the light-emitting units.

10. The light-emitting device of claim 1, wherein the separating portion of the sealing member has a thickness greater than a half of a height of the LED chips.

11. The light-emitting device of claim 1, wherein the convex upper surface and the concave upper surface are spaced apart in a direction of a thickness of the fluorescence layers or of the fluorescence layer by a distance not greater than 15% of a thickness of the fluorescence layers or of the fluorescence layer.

12. The light-emitting device of claim 1, further comprising an antistatic element, wherein the antistatic element is disposed on the substrate, is electrically connected to the electrode pads, and is covered by the sealing member.

13. The light-emitting device of claim 12, wherein each of two of the light-emitting units comprises a central position, the antistatic element comprises a central position, the central position of each of the two light-emitting units is spaced apart from the central position of the antistatic element by a first distance, and the central positions of the two light-emitting units are spaced apart from each other by a second distance greater than or equal to the first distance.

14. The light-emitting device of claim 12, wherein each of two of the light-emitting units comprises a central position, the antistatic element comprises a central position, the central position of each of the two light-emitting units is spaced apart from the central position of the antistatic element by a first distance, the central positions of the two light-emitting units are spaced apart from each other by a second distance, and the first distance and/or the second distance is not greater than a half of a length of a side of the surrounding portion.

15. The light-emitting, device of claim 1,
wherein the light-emitting units comprise a first light-emitting unit, a second light-emitting unit, a third light-emitting unit, and a fourth light-emitting unit.

16. The LED package structure of claim 15, wherein each of the first to the fourth light-emitting units comprises a central position, the central position of the first light-emitting unit is spaced apart from the central position of the fourth light-emitting unit by a first distance and is spaced apart from the central position of the second or the third light-emitting unit by a second distance, and the first distance is greater than the second distance.

17. The LED package structure of claim 15, wherein the first light-emitting unit is adapted to emit blue outgoing light, and the fourth light-emitting unit is adapted to emit white outgoing light.

18. The LED package structure of claim 15, wherein the separating portion has a portion lying between the first light-emitting unit and the fourth light-emitting unit and comprising a reflective substance.

* * * * *